United States Patent [19]

Ogura et al.

[11] 4,135,154

[45] Jan. 16, 1979

[54] CRT DISPLAY OF CONDITION IN CYLINDERS OF INTERNAL COMBUSTION ENGINE

[75] Inventors: Toshiaki Ogura, Cyofu; Toshio Saito, Matsudo; Hideo Higashi, Takatsuki; Yoshimichi Yamazaki, Settsu, all of Japan

[73] Assignee: Banzai, Ltd., Tokyo, Japan

[21] Appl. No.: 786,054

[22] Filed: Apr. 8, 1977

[30] Foreign Application Priority Data

Apr. 9, 1976 [JP] Japan .................................. 51-40070

[51] Int. Cl.[2] .............................................. G01R 13/42

[52] U.S. Cl. .................................. 324/16 S; 73/117.3

[58] Field of Search ..................... 324/165, 15; 73/116, 73/117.3, 118

[56] References Cited

U.S. PATENT DOCUMENTS

| | | | |
|---|---|---|---|
| 2,366,355 | 1/1945 | Roberts | 324/16 S |
| 2,608,093 | 8/1952 | Traver | 324/16 S |
| 3,005,948 | 10/1961 | Broder et al. | 324/16 S |
| 3,404,333 | 10/1968 | Roberts | 324/15 |
| 3,409,824 | 11/1968 | Makuh | 324/16 S |
| 3,573,608 | 4/1971 | Marino et al. | 324/16 S |

FOREIGN PATENT DOCUMENTS

| | | | |
|---|---|---|---|
| 826785 | 11/1969 | Canada | 324/16 S |

*Primary Examiner*—Stanley T. Krawczewicz
*Attorney, Agent, or Firm*—Fleit & Jacobson

[57] ABSTRACT

Multi-electric discharges in the spark plugs of an electric ignition type engine to be inspected is sustained through a fixed angle of the engine cycle from the timing of spark ignition. For this period the electric discharge wave sustained in the spark plug is displayed. From the electric discharge wave displayed one can determine what are the change in pressure and the conditions of combustion gas in the combustion chamber of the engine.

2 Claims, 5 Drawing Figures

CRT DISPLAY OF CONDITION IN CYLINDERS OF INTERNAL COMBUSTION ENGINE

BACKGROUND OF THE INVENTION

1. Field of the Invention

This invention relates to diagnosis of electric ignition type engines.

2. Description of the Prior Art

Heretofore, there has been proposed an engine scope for use in inspection of an electric ignition type engine wherein voltage waves appearing across the segments of the distributer of the engine and voltage waves appearing at the secondary side of the ignition coil are displayed, whereby one can determine what are the conditions of the ignition system of the engine and the pressure and the conditions of mixture gas in the combustion chamber of the engine. However, such engine scopes permit only very skillful workers to accurately determine the conditions of the combustion chamber of an engine for the following reasons. Since electric discharge in the spark plug continues only for a time which is as short as one thousandth of a second, the amount of information obtainable from such electric discharge is very much limited. Furthermore, the electric discharge tends to be influenced by changes in the concentration and the pressure of mixture gas in the space between the electrodes of the spark plug.

There has been also proposed a method of determining the conditions of the combustion chamber of an engine by using a strain gauge, a piezo-electric element, or the like. However, such conventional method requires a number of cumbersome preparatory workings such as replacing of plugs and machining of cylinder head.

It is an object of this invention to eliminate the drawbacks of the conventional device and method and to provide a method of and an apparatus for inspecting an electric ignition type engine and capable of accurately and easily determining the pressure in the cylinder of the engine, the conditions of mixture gas such as the concentration and the condition of eddy flow of the mixture gas, and the operating condition of the exhaust valve.

SUMMARY OF THE INVENTION

According to this invention, multi-electric discharges in the spark plugs of an engine are established through a predetermined angle of each engine cycle from the timing of spark ignition. For this period the electric discharge wave sustained in the spark plug is displayed. From the electric discharge wave displayed one can determine what are the change in pressure and the conditions of combustion gas in the combustion chamber of the engine.

This invention will now be described in detail in connection with the preferred embodiment of this invention by reference to the accompanying drawings.

DESCRIPTION OF THE PREFERRED EMBODIMENTS

Figure 1:
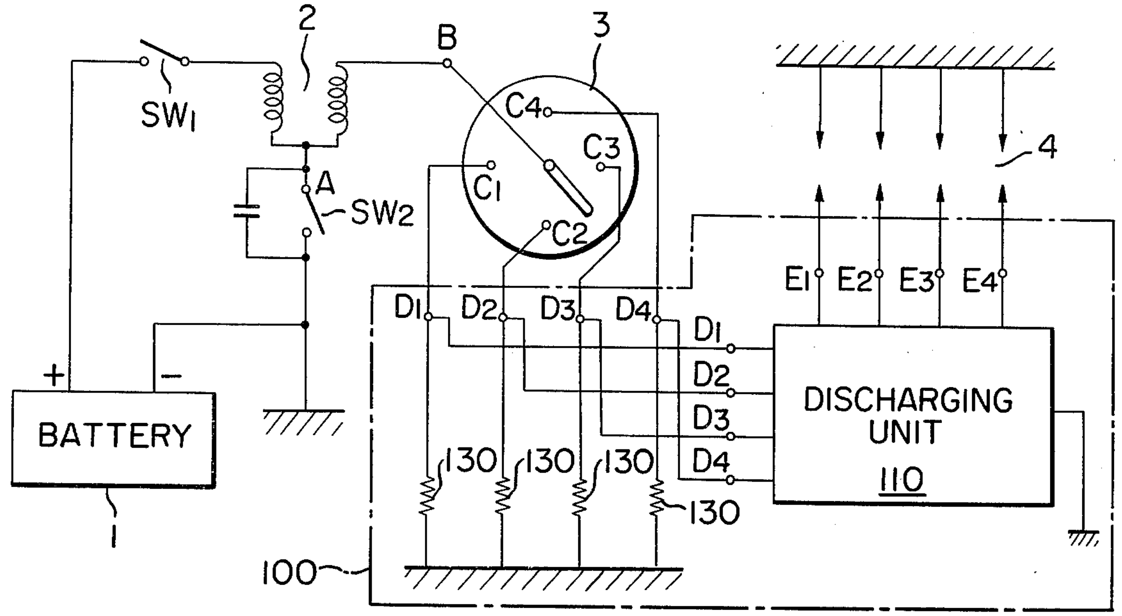
FIG. 1 is a circuit diagram showing an embodiment of the apparatus for inspecting an electric ignition type engine according to this invention in connection with the ignition system of the engine to be inspected.

Referring now to FIG. 1, there is diagrammatically shown an example of the apparatus for inspecting an electric ignition type engine according to this invention, connected to the ignition system of the engine to be inspected. The inspecting apparatus 100 comprises a discharging unit 110, an engine scope 120 (see FIG. 2) and fixed resistors 130. The engine scope 120 may be a cathode ray scope or any other conventional display device capable of a raster type display.

As shown in FIG. 1, an electric ignition type engine generally comprises a battery 1, an ignition coil 2 the primary coil of which is connected across the battery 1 through switches $SW_1$ and $SW_2$, a distributor 3 connected to the secondary coil of the ignition coil 2 and spark plugs 4 connected to respective segments $C_1$, $C_2$, $C_3$ and $C_4$ of the distributor 3. To inspect the electric ignition type engine on the pressure in the cylinder, the condition of eddy flow of mixture gas in the cylinder and the operating condition of the exhaust valve, the respective terminals of the inspecting apparatus 100 of this invention are connected between the segments $C_1$, $C_2$, $C_3$ and $C_4$ and the spark plugs 4.

More particularly, the terminals $D_1$, $D_2$, $D_3$ and $D_4$ of the inspecting apparatus 100 are connected to earth through the respective resistors 130. For inspecting, the terminals $D_1$, $D_2$, $D_3$ and $D_4$ are connected to the corresponding segments $C_1$, $C_2$, $C_3$ and $C_4$ of the distributor 3. The terminals $D_1$, $D_2$, $D_3$ and $D_4$ are also connected to the corresponding terminals $D_1$, $D_2$, $D_3$ and $D_4$ of the discharging unit 110. The terminals $E_1$, $E_2$, $E_3$ and $E_4$ of the discharing unit 110 are connected to the corresponding spark plugs 4. The terminals $E_1$, $E_2$, $E_3$ and $E_4$ of the discharging unit 110 are adapted to be connected to the corresponding terminals $E_1$, $E_2$, $E_3$ and $E_4$ of the engine scope 120 so that electric discharge waves at the respective spark plugs 4 may be displayed on the display surface of the engine scope 120. The engine scope 120 is provided with terminals A and B. To display primary or secondary electric waves in the ignition coil 2, the terminals A or B of the engine scope 120 may be connected to the corresponding terminals A or B (see FIG. 1) of the ignition coil 2.

The discharging unit 110 of the inspecting apparatus 100 of this invention as shown in FIG. 1 will be described in detail in connection with FIG. 3. The discharging unit 110 comprises shaping circuits 111 connected to the respective terminals $D_1$, $D_2$, $D_3$ and $D_4$, flip-flop circuits 112 with a set input S connected to the output of the corresponding shaping circuit 111 and a reset input R connected to the output of the shaping circuit next to the corresponding one, and transistors 113 the base of which is connected to the output of the corresponding flip-flop circuit 112. The emitter of the respective transistor 113 is connected to earth, and the collectors of the respective transistors 113 are connected to respective terminals $F_1$, $F_2$, $F_3$ and $F_4$ through the primary coils of respective boosting transformer 114. A common high frequency pulse source 115 or separate sources of, for example about 15 KHz, 12 volts, and 3 amps are connected to the respective terminals $F_1$, $F_2$, $F_3$ and $F_4$. The supplied voltage from the high frequency pulse source 115 is transformed by the boosting transformer 114 into a voltage of sufficient magnitude to fire a spark plug. The secondary coils of the respective boosting transformers 114 are connected between the respective terminals $E_1$, $E_2$, $E_3$ and $E_4$ and earth.

Figure 2:
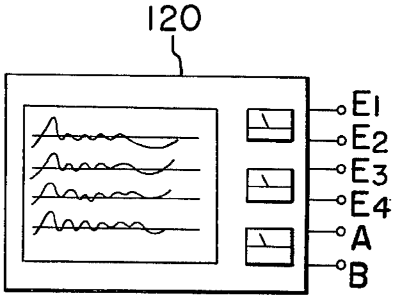
FIG. 2 shows the connection points of the engine scope for use with the inspecting apparatus of FIG. 1.
Figure 3:
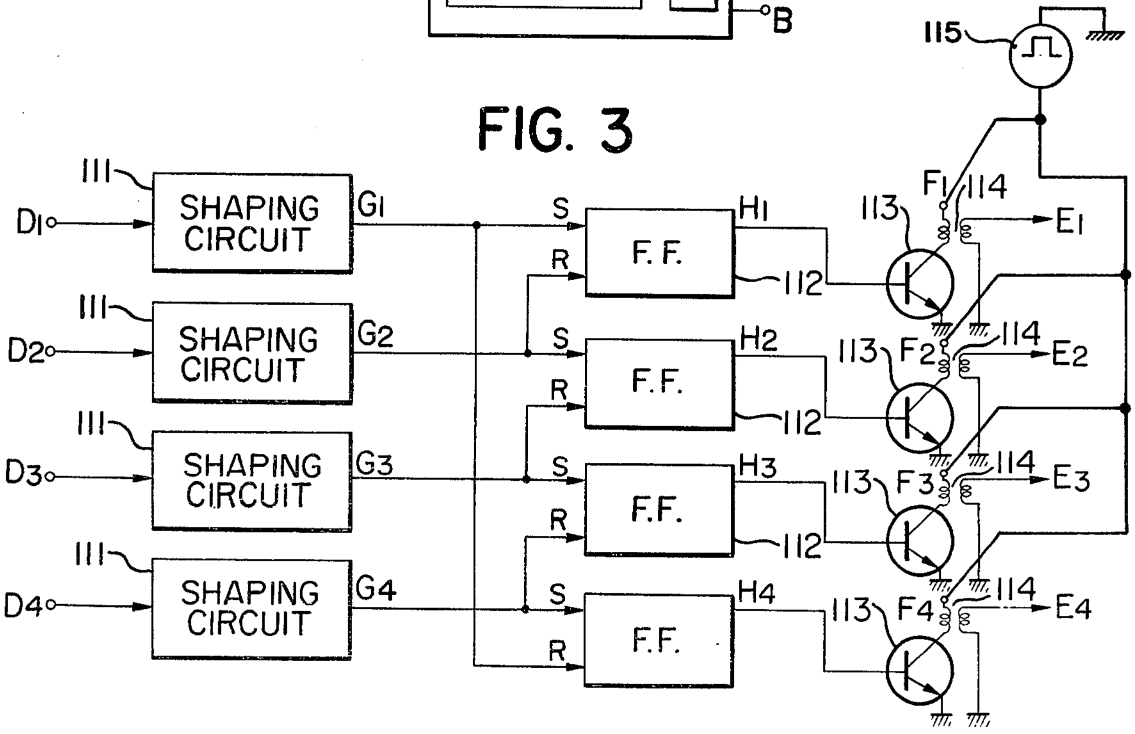
FIG. 3 is a detailed circuit diagram showing the discharging unit of the inspecting apparatus of FIG. 1.
Figure 4:
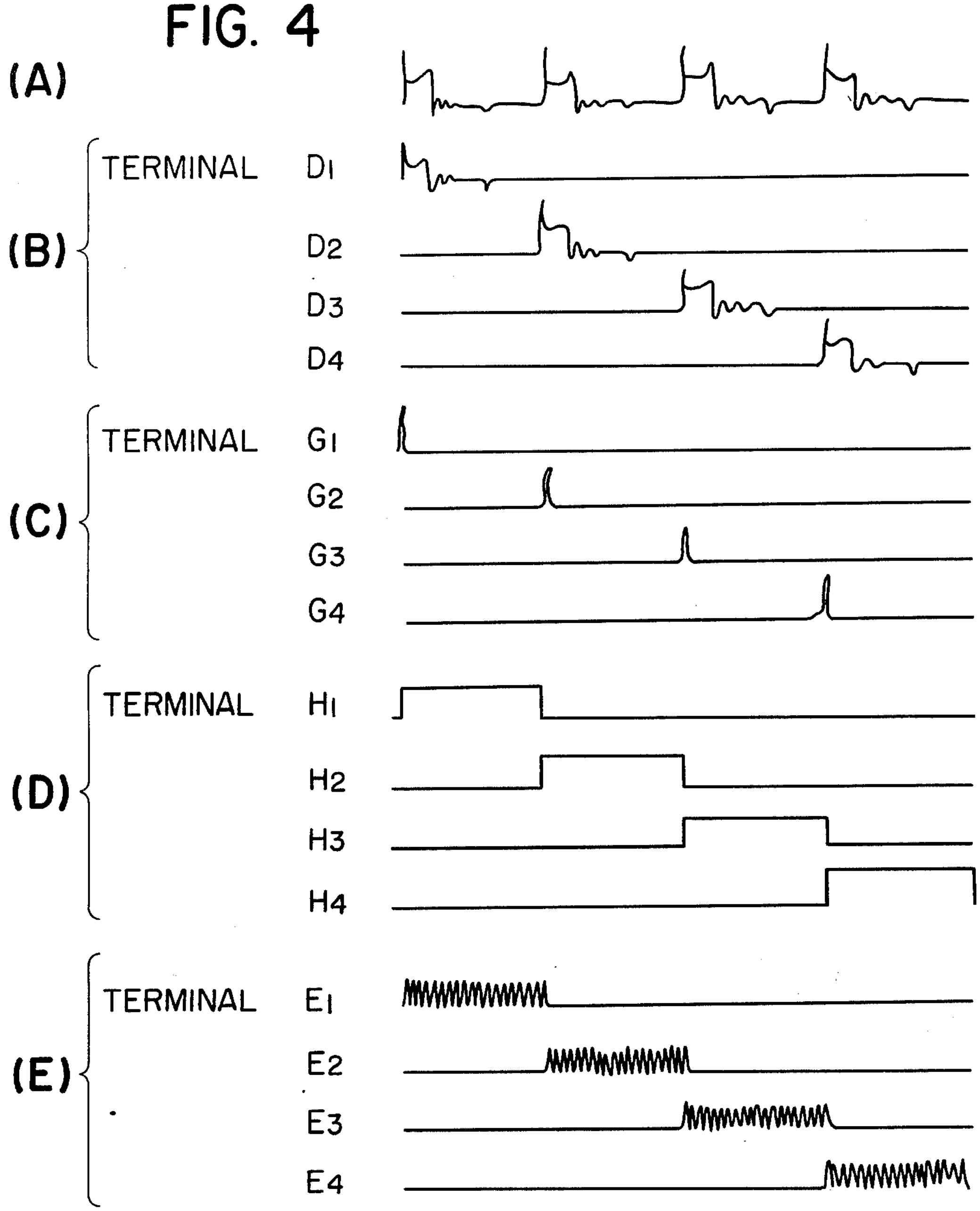
FIG. 4 graphically illustrates voltage waves at different points of the circuit of FIG. 1.

Operation of the inspecting apparatus as shown in FIGS. 1, 2 and 3 will be described in connection with the different waves as shown in FIG. 4.

FIG. 4 (A) illustrates a secondary voltage wave (terminal B) appearing across the ignition coil as shown in FIG. 1. The secondary voltage of the ignition coil is distributed through each of the segments $C_1$, $C_2$, $C_3$ and $C_4$ of the distributor 3 to each of the fixed resistors 130 which serve as timing detecting sensors. Thus voltage waves as shown in FIG. 4 (B) appear at the respective terminals $D_1$, $D_2$, $D_3$ and $D_4$. The shaping circuits 111 process the voltage waves appearing at the terminals $D_1$, $D_2$, $D_3$ and $D_4$ so as to produce timing pulses as shown in FIG. 4 (C) at their output terminals $G_1$, $G_2$, $G_3$ and $G_4$. The shaping circuits 111 may be Schmitt triggers or any other conventional devices which generate an output pulse of constant amplitude as long as the voltage across an associated fixed resistor 130 exceeds a certain value. The flip-flop circuits 112 are turned on and off by the timing pulses appearing at the terminal $G_1$, $G_2$, $G_3$ and $G_4$ to produce outputs as shown in FIG. 4 (D) at their output terminals $H_1$, $H_2$, $H_3$ and $H_4$. More particularly, the flip-flop circuit 112 corresponding to the terminal $D_1$ is first turned on when a timing pulse from the output terminal $G_1$ of the corresponding shaping circuit 111 is applied to its set input S, and then turned off when a timing pulse from the output terminal $G_2$ of the next shaping circuit 111 is applied to its reset input R, thereby providing an output wave as indicated by terminal $H_1$ in FIG. 4 (D). Since the timing pulse appearing at the output terminal $G_2$ of the shaping circuit 111 is also applied to the set input S of the flip-flop circuit 112 corresponding to the terminal $D_2$, the flip-flop circuit 112 is turned on simultaneously with the turning off of the flip-flop circuit 112 corresponding to the terminal $D_1$. Then, the flip-flop circuit 112 corresponding to the terminal $D_2$ is turned off at the time of receiving at its reset input R a timing pulse appearing at the output terminal $G_3$ of the next shaping circuit 111. In this matter, the flip-flop circuits 112 are successively turned on and off, thereby providing outputs in the timing as shown in FIG. 4(D). Each of the transistors 113 is in conductive condition while an output as described above appears at the corresponding one of the terminals $H_1$, $H_2$, $H_3$ and $H_4$ of the flip-flop circuits 112, so that a high frequency current from the high frequency pulse source connected to the corresponding one of the terminals $F_1$, $F_2$, $F_3$ and $F_4$ can flow through the primary coil of the corresponding boosting transformer 114 to earth, thereby providing boosted high frequency pulse voltages at the terminals $E_1$, $E_2$, $E_3$ and $E_4$ in the timing as shown in FIG. 4(E).

Thus, in the timing as shown in FIG. 4(E), a high frequency and high voltage pulse is successively applied to the spark plugs 4, whereby multi-electric discharges in each spark plug 4 can be established through about one-fourth of the engine cycle from the timing spark ignition.

Although in the embodiment described above multi-electric discharges are sustained through about one-fourth of the engine cycle, such multi-electric discharges may be established through any predetermined angle of each engine cycle from the timing of spark ignition, for example by detecting the corresponding angular position of a crank pulley associated with the engine system by use of an angular position detector such as a magnetic sensor and stopping the multi-electric discharges in response to the detection.

A process of inspecting an electric ignition type engine by means of the inspecting apparatus of this invention as described above will be described by way of example.

The spark cords of an electric ignition type engine to be inspected are firstly removed from the spark plugs and then connected to the respective terminals $D_1$, $D_2$, $D_3$ and $D_4$ of the apparatus 100 of this invention. The terminals $E_1$, $E_2$, $E_3$ and $E_4$ of the inspecting apparatus 100 of this invention are connected to the spark plugs. In this condition, the engine is started. As the engine is rotated, the waves of discharging voltages appearing between the terminals $E_1$, $E_2$, $E_3$ and $E_4$ and earth are displayed on the cathode-ray tube of the engine scope 120. From the discharging voltage waves one can determine various conditions in the combustion chamber of the engine.

Examples of such determination will be described in connection with FIG. 5.

Figure 5:
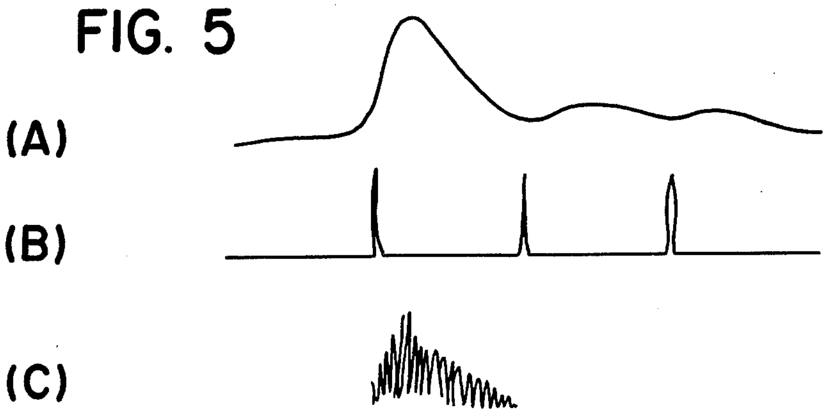
FIG. 5 graphically illustrates change in pressure within the cylinder of the engine being inspected and timing pulses and discharge wave in the inspecting apparatus of this invention.

FIG. 5(A) graphically shows a change in pressure within the cylinder corresponding to the spark plug 4 connected to the terminal $E_1$, FIG. 5(B) shows timing pulses as produced at the terminals $G_1$, $G_2$ and $G_3$ on the same timing-axis, and FIG. 5(C) shows an example of discharge voltage wave appearing between the terminal $E_1$ and earth and displayed on the cathode-ray tube of the engine scope 120. From FIG. 5, it should be noted that the envelope of the discharge voltage wave as shown in FIG. 5(C) approximates to the change in pressure within the cylinder as shown in FIG. 5(A) and therefore one can determine the change in pressure within the cylinder by analogy with the change in discharge voltage displayed on the cathode-ray tube of the engine scope 120.

Furthermore, it is well known that the firing potential depends on the pressure and concentration of the mixture gas. The inspecting method and apparatus of this invention enable one to determine the concentration of mixture gas passing through the spark plug gaps from such nature. For instance, in an engine having a cylinder head so shaped as to ensure that efficient combustion of mixture gas in the form of eddy flow is effected within the cylinder, when a portion of the eddy-flow mixture gas having a higher concentration passes through the plug gap the discharge voltage is lowered and when a portion of the eddy-flow mixture gas having a lower concentration passes through the spark plug gap the discharge voltage is raised. In view of this fact, a small oscillatory voltage wave as displayed on the engine scope 120 may be considered to reflect the condition of the eddy flow of mixture gas having thin and thick portions. Thus one can determine the condition of mixture gas flow from such oscillatory voltage wave. Moreover, since the discharge voltage is also changed by the abrupt change in pressure within the cylinder due to the actuation of the exhaust valve, if the sticking of the exhaust valve occurs, the change in pressure attributable to the exhaust valve would become abnormal. Therefore, by detecting such abnormal change by means of the apparatus of this invention one can find out that the valve sticking has occurred. A sticking exhaust valve can be distinguished from a sticking intake valve by paying attention to whether such abnormal change occurs at a high rotational speed or at low rotational speed of the engine.

With the inspecting method and apparatus of this invention the following advantages can be obtained.

(1) In the method and apparatus of this invention, multi-electric discharges in the spark plug of an electric ignition type engine to be inspected is sustained through a fixed angle of the engine cycle from the timing of spark ignition and for this period the electric discharge wave is displayed. Therefore, a large amount of information is obtainable so as to enable even an unskilled person to accurately determine the conditions of the combustion chamber including not only the change in pressure within the combustion chamber, but also the change in concentration of the mixture gas, the conditions of plugs, the operating conditions of the exhaust valve, etc.

(2) The conditions of the combustion chamber can be determined without any strain gauges and piezo-electric elements which would be needed in conventional method. Therefore, the present method and apparatus require no cumbersome preparatory working such as replacing of plugs and machining of cylinder head. The only preparatory working that is needed to inspect an engine by means of the present apparatus is to replace the spark plug cords.

(3) In the present apparatus, measuring signals are extracted from the parts of the spark plugs and stable D.C. high voltages or high pulse voltages are supplied to the spark plugs directly from the discharging unit 110. Therefore, the results of inspection are not influenced by the quality of the ignition system of the car on which the engine being inspected is to be mounted.

(4) To inspect the ignition system of a car by use of the present apparatus, the segments of the distributor are connected to the fixed resistors in place of the plugs. Therefore, the measuring conditions can be kept constant.

We claim:

1. An apparatus for inspecting an electric ignition type engine comprising timing pulse forming circuits connected to the segments of the distributor of the engine for forming timing pulses from the secondary voltages of the ignition coil distributed by the distributor, a high frequency pulse source, boosting transformers each having a high voltage coil and a low voltage coil, said each high voltage coil being connected across the corresponding spark plug, switching elements each connected through the low voltage coil of the corresponding boosting transformer across said pulse source and adapted to be made conductive to allow the voltage from said pulse source to be applied to the corresponding spark plug so as to establish multi-electric discharges in the spark plug in response to the timing pulse from the corresponding one of the timing pulse forming circuits and to be made non-conductive to stop the voltage from being applied to said corresponding spark plug in response to the timing pulse from the timing pulse forming circuits next to said corresponding one, and means connected to the spark plugs for displaying said electric discharge waves.

2. An apparatus as claimed in claim 1 wherein each of said timing pulse forming circuits comprises a fixed resistor connected between the corresponding one of said segments and earth and a shaping circuit connected to one end of said fixed resistor for transforming the voltage appearing at one end of said fixed resistor into a timing pulse, and further including flip-flop circuits each having a set input, a reset input and an output, said each set input being connected to the output of the shaping circuit of the corresponding timing pulse forming circuit, said each reset input being connected to the output of the shaping circuit of the next timing pulse forming circuit, and said each output being connected to the on-off control terminal of the corresponding switching element.

* * * * *